United States Patent
Barrow et al.

(12)

(10) Patent No.: US 6,828,836 B1
(45) Date of Patent: Dec. 7, 2004

(54) TWO COMPARATOR VOLTAGE MODE PWM

(75) Inventors: Steven Michael Barrow, Gilbert, AZ (US); Robert Kenneth Oppen, Chandler, AZ (US); Steven Harris, Chandler, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/658,505

(22) Filed: Sep. 9, 2003

(51) Int. Cl.[7] .............................................. H03K 3/017
(52) U.S. Cl. ...................................... 327/172; 327/174
(58) Field of Search ................................. 327/172–175

(56) References Cited

U.S. PATENT DOCUMENTS 6,198,265 B1    3/2001   Stevenson ................... 323/288
6,636,124 B1 *  10/2003  Liu ............................. 332/109

* cited by examiner

Primary Examiner—Kenneth B. Wells
(74) Attorney, Agent, or Firm—Brett A. Hertzberg; Merchant & Gould PC

(57) ABSTRACT

Two comparators are arranged to generate a pulse-width modulator (PWM) control pulse. The first comparator is arranged to start the PWM control pulse, while the second comparator is arranged to stop the PWM control pulse. The first comparator can be a high speed CMOS comparator that includes a built-in offset. The first and second comparators can be arranged such that the built-in offset of the first comparator dominates the overall operation at the start of the control pulse. The start of the PWM control pulse is initiated by a ramp voltage and a predetermined reference level instead of a clock edge. The PWM control pulse can be linearly varied down to a zero pulse width. The PWM control pulse may be used to control the on-time of the switching element in a switching-type converter.

20 Claims, 4 Drawing Sheets

TWO COMPARATOR VOLTAGE MODE PWM

FIELD OF THE INVENTION

The present invention is related to pulse width control. More particularly, the present invention is related to a system and method for generating a pulse control signal using two comparators.

BACKGROUND OF THE INVENTION

DC—DC converters are switching regulators that typically employ pulse-width modulation (PWM) control. The converter is arranged to control the on-time of a switching element. The output of the switching element is a pulsed input voltage (VIN) that is coupled to a filter network such as an L-C filter. The L-C filter stores energy from the voltage pulse to provide an average output voltage (VOUT). The average output voltage is related to the pulsed input voltage (VIN) by the pulse on-time (TON) and the period of the pulse (TP) as given by: VOUT=VIN*TON/TP. By varying the on-time (TON) of the pulsed input voltage (VIN), the average output voltage (VOUT) can be adjusted.

During the on-time, the switching element is activated such that input voltage (VIN) is connected to the inductor (L). The difference between the input voltage (VIN) and the output voltage (VOUT) is forced across the inductor, causing the current flow through the inductor to increase. During the on-time, current is delivered to the capacitor (C) and the load through the inductor. The output voltage (VOUT) increases as current is delivered to the capacitor (C).

During the off-time, voltage applied to the inductor is removed. Since current in an inductor cannot change instantaneously, the voltage across the inductor will adjust to hold the current constant. A freewheeling diode is typically connected in parallel with the L-C filter circuit. The input end of the inductor is forced negative in voltage eventually reaching the point where the diode is turned on. The inductor current then flows through the load and back through the diode. The capacitor discharges into the load during the off time, contributing to the total current being supplied to the load. The total load current during the switch off-time corresponds to the sum of the inductor and capacitor current.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1:
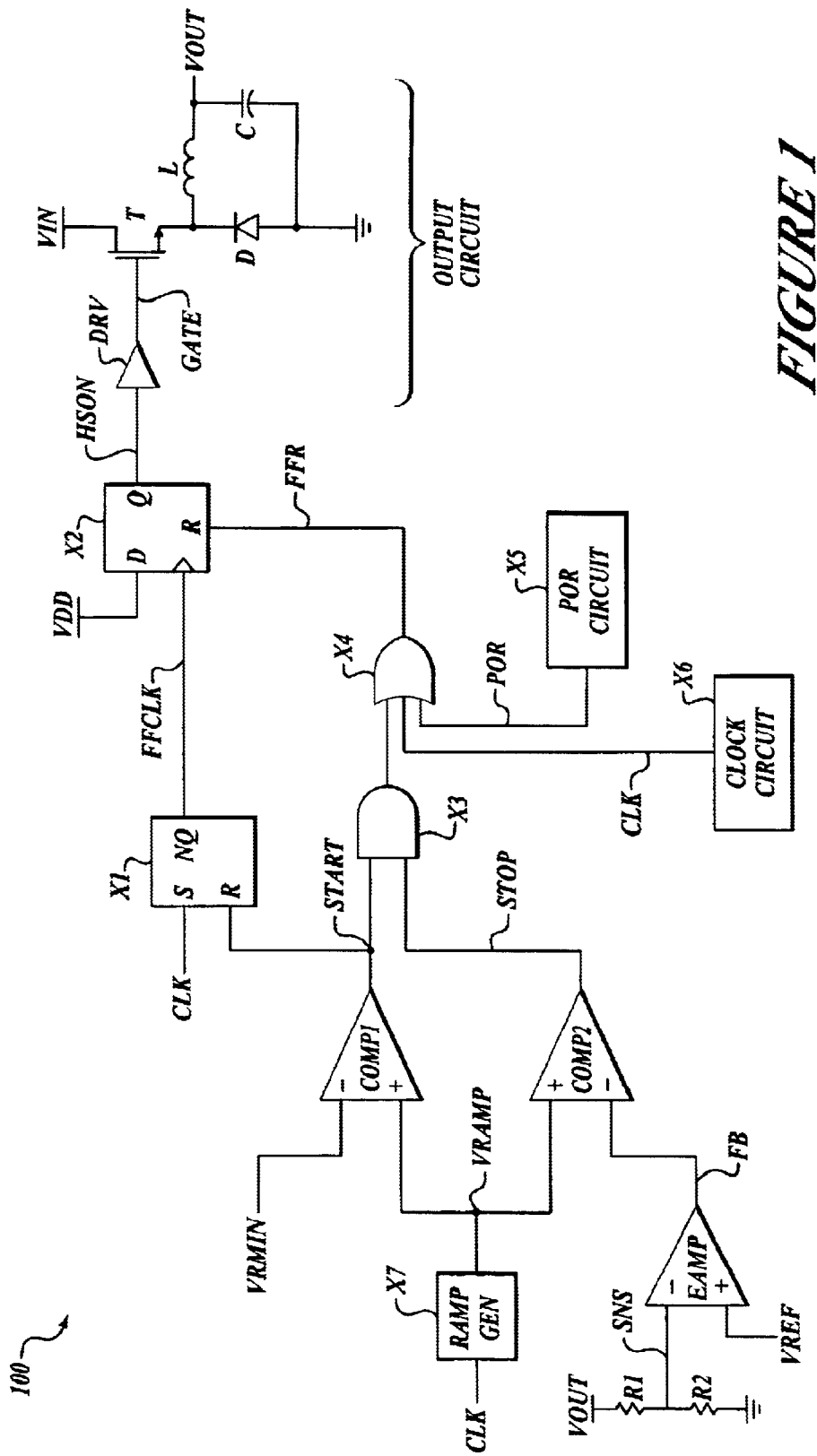
FIG. 1 is a schematic illustration of a PWM circuit for an embodiment of the present invention.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meaning of "a," "an," and "the" includes plural reference. The meaning of "in" includes "in" and "on." The term "connected" means a direct connection between the items connected, without any intermediate devices. The term "coupled" refers to both direct connections between the items connected, and indirect connections through one or more intermediary items. The term "circuit" may refer to both single components, and to a multiplicity of components. The term component refers to one or more items that are configured to provide a desired function. The term "signal" includes signals such as currents, voltages, charges, logic signals, data signals, optical signals, electromagnetic waves, as well as others.

Briefly stated, the present invention is related to a circuit that employs two comparators to generate a pulse-width modulator (PWM) control pulse. The first comparator is arranged to start the PWM control pulse, while the second comparator is arranged to stop the PWM control pulse. The first comparator can be a high speed CMOS comparator that includes a built-in offset. The first and second comparators can be arranged such that the built-in offset of the first comparator dominates the overall operation at the start of the control pulse. The start of the PWM control pulse is initiated by a ramp voltage and a predetermined reference level instead of a clock edge. The PWM control pulse can be linearly varied down to a zero pulse width. The PWM control pulse may be used to control the on-time of the switching element in a switching-type converter.

FIG. 1 is an illustrative schematic diagram of a PWM circuit (100) that is arranged in accordance with an embodiment of the present invention. PWM circuit 100 includes two comparators (COMP1, COMP2), two memory circuits (X1, X2), two logic circuits (X3, X4), a ramp generator (X7), an error amplifier (EAMP), a power-on-reset (POR) circuit (X5), a clock circuit (X6), two resistors (R1, R2), and an output circuit. The output circuit includes a driver (DRV), a transistor (T), a diode (D), an inductor (L), and a capacitor (C). Memory circuits X1 and X2 are represented as an SR-type latch and a D-type flip-flop, respectively. Logic circuits X3 and X4 are represented as an AND logic circuit and an OR logic circuit, respectively.

The first comparator (COMP1) is arranged to compare signals VRMIN and VRAMP to provide a start signal (START). The second comparator (COMP2) is arranged to compare signals VRAMP and FB to provide a stop signal (STOP). The output (signal FFCLK) of memory circuit X1 is asserted in response to the start signal (START), and de-asserted in response to a clock signal (CLK). The output (signal HSON) of memory circuit X2 is reset in response to a reset signal (FFR), and is asserted after a clocking edge (e.g., a positive edge) is generated via signal FFCLK. Signal HSON is arranged to activate the output circuit when asserted.

Resistors R1 and R2 form a voltage divider that provides a sense voltage (SNS) in response to the output voltage (VOUT). Error amplifier EAMP is arranged to compare the sense voltage (SNS) to a reference voltage (REF) to provide a feedback signal (FB). Ramp generator X7 is arranged to provide a ramp signal (VRAMP) that is periodically reset in response to a clock signal (CLK). Logic circuits X3 and X4 are arranged such that signal FFR is asserted when: the clock signal is asserted, a POR signal is asserted, or the START and STOP signals are both asserted. POR circuit X5 is arranged to assert the POR signal during a power-on condition, while clock circuit X6 is arranged to provide the clock signal (CLK).

VRMIN is a reference level that is adjusted to change the point where the start pulse is initiated by the first comparator relative to the ramp signal (VRAMP). In one example, VRMIN corresponds to the minimum voltage of the ramp signal (VRAMP) and the built-in offset of the first comparator is non-zero. In another example, VRMIN corresponds to a predetermined amount above the minimum ramp signal (VRAMP) and the built-in offset of the first comparator is approximately zero.

The PWM circuit illustrated in FIG. 1 utilizes the clock signal (CLK) to initiate timing control. The output circuit, via signal HSON, initiates a pulse based on the outputs of the comparators. The input voltage supply (VIN) is selectively coupled to the load through inductor L such that inductor L charges when transistor T is activated. The ramp signal (VRAMP) is reset to a minimum level by the clock signal. The pulse width associated with signal HSON is determined by the output voltage (VOUT) and the minimum reference level (VRMIN) for the ramp generator. The start signal (START) is initiated whenever the ramp signal (VRAMP) is above VRMIN (or above VRMIN by the built-in offset associated with the first comparator). The stop signal (STOP) is initiated whenever the ramp signal (VRAMP) is above the feedback signal (FB). The start and stop signals are simultaneously evaluated by the logic circuits and the memory circuits to initiate the control pulse (signal HSON) for the driver circuit.

The duty cycle of the pulse width is dictated by the in and out voltages (VIN, VOUT). For example, increasing values of VIN may result in narrower pulse widths while decreasing values of VIN may result in wider pulse widths. Moreover, the frequency associated with the clock signal may impact the pulse width. FIG. 1 illustrates a PWM circuit that has a substantially linear response down to an approximately zero pulse width (e.g., InS or less). Conventional PWM controllers do not typically operate with linear responses over a wide range of pulses because of delays in the controller and the various comparator delays.

In one example of the present invention, the first comparator is a high speed comparator with a built-in offset and signal VRMIN corresponds to the minimum voltage associated with the ramp signal (VRAMP). In another example, the first comparator is a high-speed comparator with little or no built-in offset and signal VRMIN is greater than the minimum voltage that is associated with the ramp signal (VRAMP) by an amount that is equivalent to an offset. In yet another example, the second comparator is a high-speed comparator with very low or no offset relative to the built-in offset of the first comparator (or the offset that is included in VRMIN). The relative difference in the offsets of the comparators (or the comparators relative to the offset included in VRMIN) allows the start of the control pulse (signal HSON) to be the same as the stop signal (STOP). The pulse width can be linearly decreased to zero with this circuit topology. The second comparator can be further arranged for rail-to-rail operation to permit a wide range of pulse widths when the range of the ramp signal is close to the power supply rails.

Figure 2:
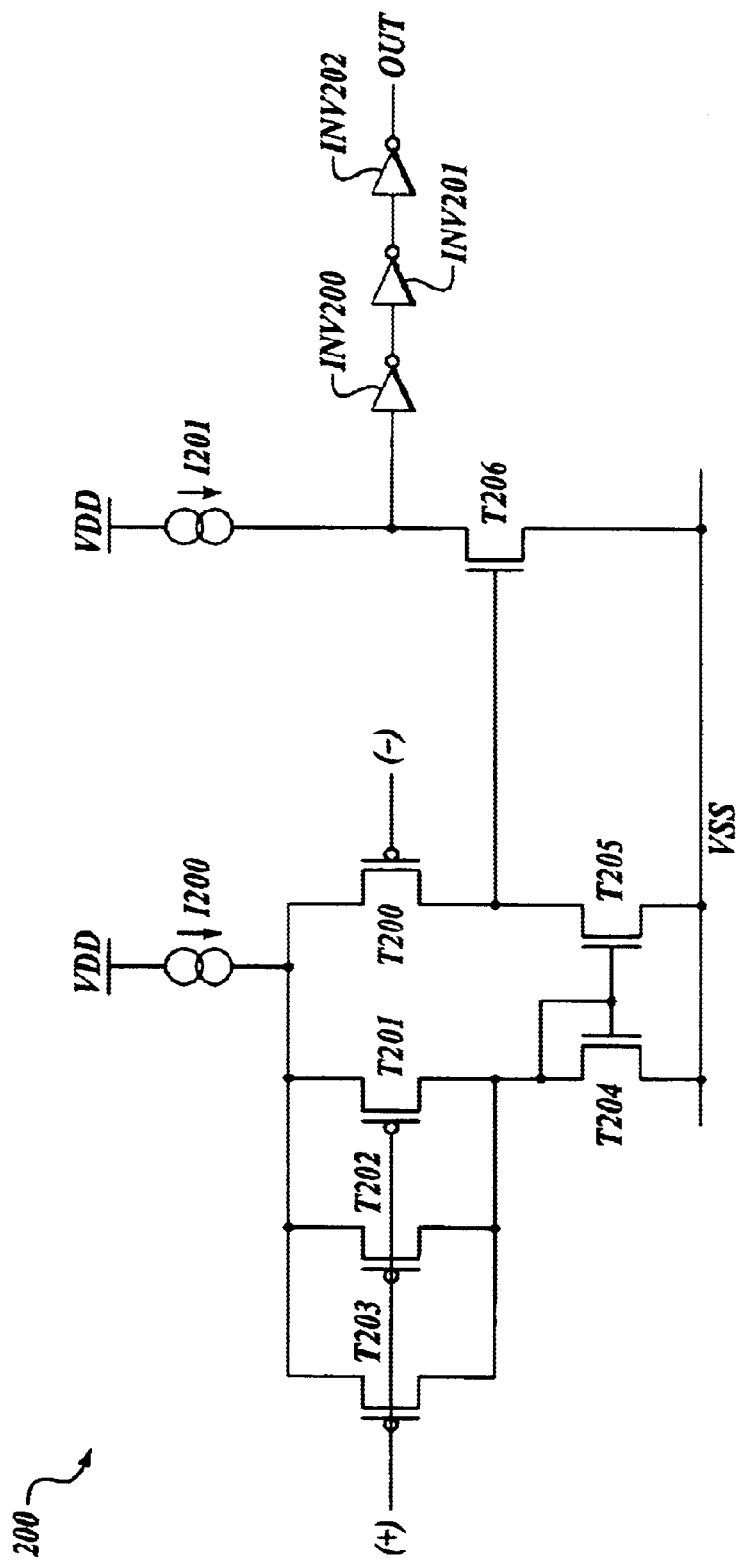
FIG. 2 is a schematic illustration of a comparator circuit (200) with a built-in offset for an example embodiment of the present invention.

FIG. 2 is a schematic illustration of a comparator circuit (200) with a built-in offset for an example embodiment of the present invention. Comparator circuit 200 includes seven transistors (T200–T206), two current sources (I200–I201), and three inverter circuits (INV200–INV202).

Transistors T200–T203 and current source I200 are arranged to operate as a differential pair circuit. Since the transistors in the differential pair circuit are unbalanced (e.g., a 3:1 ratio in sizes), the overall operation of the comparator circuit (200) includes a built-in offset that is "skewed" in a predictable direction (e.g., an offset with a predictable polarity with a predictable minimum magnitude). Transistors T204 and T205 are arranged as a current mirror circuit that is coupled to the differential pair circuit to form a trans-conductance cell. Transistor T206 and current source I201 are arranged to operate as an inverting gain stage that is responsive to the trans-conductance cell. Inverters INV200–INV202 increase the gain associated with the output of the inverting gain stage.

Figure 3:
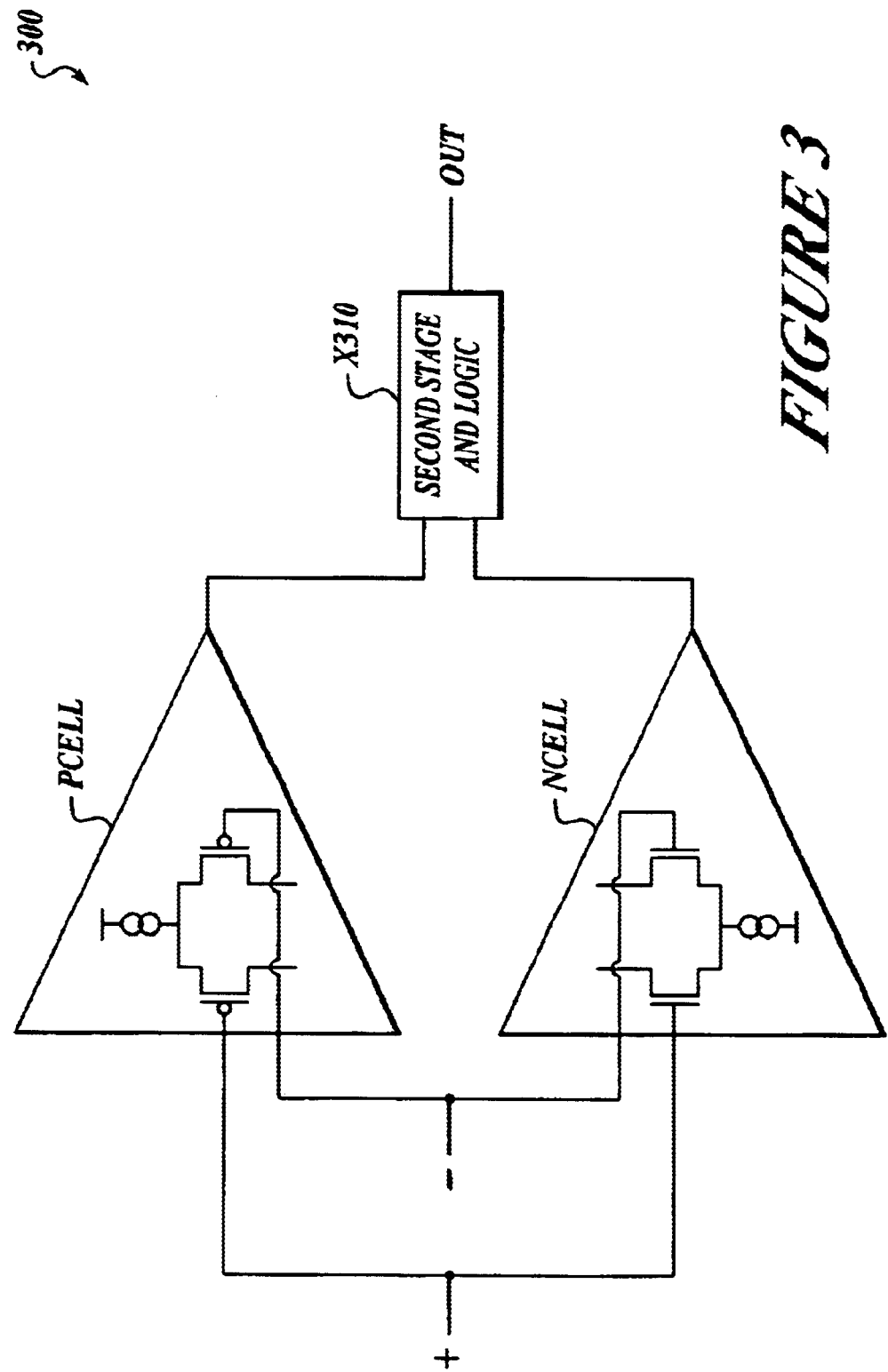
FIG. 3 is a schematic illustration of a rail-to-rail comparator circuit for an example embodiment of the present invention.

FIG. 3 is a schematic illustration of a rail-to-rail comparator circuit (300) for an example embodiment of the present invention. Rail-to-rail comparator circuit 300 includes a p-type amplifier cell (PCELL), an n-type amplifier cell (NCELL), and a second stage and logic circuit.

The p-type amplifier cell (PCELL) includes a differential pair with p-type transistors. The p-type amplifier cell has an input common-mode range that ranges down to a low power supply rail (e.g., VSS). The n-type amplifier cell (NCELL) includes a differential pair with n-type transistors. The n-type amplifier cell has an input common-mode range that ranges down to a high power supply rail (e.g., VDD). The p-type amplifier cell and the n-type amplifier cell have outputs that are combined by a second stage circuit that includes additional logic to ensure proper operation as a comparator. Rail-to-rail comparator circuit 300 is arranged to operate with an input common-mode range between the high and low power supply rails.

Figure 4:
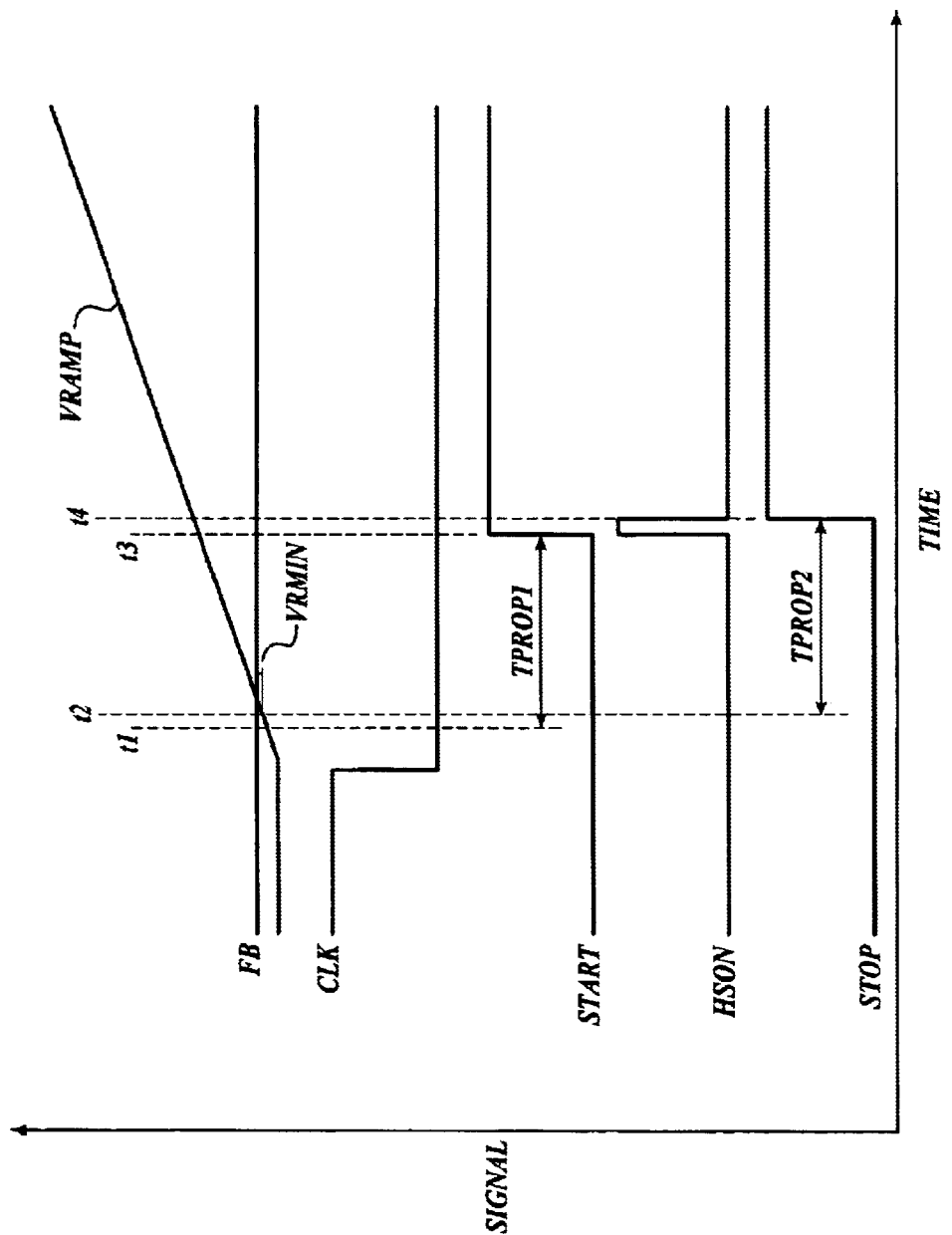
FIG. 4 is an illustration of various timing signals for an example embodiment of the present invention.

FIG. 4 is an illustration of various timing signals for an example embodiment of the present invention. Initially, the clock signal corresponds to logic 1such that: the outputs (e.g., FFCLK and HSON) of memory circuits X1 and X2 are set to logic 0. Also, the ramp signal (VRAMP) is reset to a minimum level by the clock signal (CLK) and the start and stop signals (START, STOP) correspond to logic 0. The ramp (VRAMP) is initiated when the clock signal (CLK) changes to logic 0. At time t1, the ramp signal (VRAMP) reaches the reference level (VRMIN) for the first comparator. The propagation delay (tprop1) through the first comparator and other circuits result in the initiation of the start pulse at time t3. At time t2, the ramp signal (VRAMP) reaches the level associated with the feedback signal (FB). The propagation delay (tprop2) through the second comparator and other circuits result in the initiation of the stop pulse at time t4. From time t3 through t4 the control pulse (HSON) is asserted.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for adjusting a pulse width of a control signal, comprising:

a first comparator circuit that is arranged to provide a start signal in response to a ramp signal and a ramp reference level;

a second comparator circuit that is arranged to provide a stop signal in response to a feedback signal and the ramp signal, wherein the feedback signal is related to the pulse width of the control signal;

a first memory circuit that is arranged to provide a memory clock signal such that the memory clock signal is: asserted in response to the start signal and de-asserted in response to a clock signal;

a second memory circuit that is arranged to adjust the control signal such that the control signal is: de-asserted when a reset signal is asserted, and asserted in response to the memory clock signal when the reset signal is de-asserted;

a logic circuit that is arranged to adjust the reset signal such that the reset signal is asserted when the start and stop signals are both asserted; and a feedback circuit that is arranged to provide the feedback signal, wherein the feedback signal is related to the control signal.

2. The apparatus of claim 1, wherein the first comparator circuit has a built-in offset that has a dominant effect on the pulse width.

3. The apparatus of claim 1, wherein the ramp reference level corresponds to at least one of: a minimum level associated with the ramp signal, and a sum of the minimum level associated with the ramp signal and an offset amount such that the ramp reference level has a dominant effect on the pulse width.

4. The apparatus of claim 1, wherein the first comparator circuit includes an unbalanced differential pair such that the first comparator has a built-in offset with a predictable polarity and a predictable minimum magnitude.

5. The apparatus of claim 1, wherein the second comparator circuit is a rail-to-rail comparator.

6. The apparatus of claim 1, wherein the second comparator includes a p-type differential pair and an n-type differential pair that are arranged to operate with a rail-to-rail common-mode input range.

7. The apparatus of claim 1, wherein the first memory circuit comprises an SR-type latch.

8. The apparatus of claim 1, wherein the second memory circuit comprises a D-type flip-flop.

9. The apparatus of claim 1, wherein the logic circuit is also arranged to assert the reset signal in response to at least one of: the assertion of the clock signal, and the assertion of a power-on-reset signal.

10. The apparatus of claim 1, further comprising an output circuit that is responsive to the control signal such that the apparatus is operated as a switching converter.

11. The apparatus of claim 1, further comprising an output circuit that is arranged to provide an output voltage in response to the control signal such that the magnitude of the output voltage is related to the pulse width of the control signal.

12. The apparatus of claim 11, wherein the feedback circuit is arranged to sense the output voltage to provide the feedback signal.

13. The apparatus of claim 11, wherein the feedback circuit includes an error amplifier that is responsive to the output voltage to provide the feedback signal.

14. The apparatus of claim 1, wherein the ramp signal is initiated in response to the clock signal.

15. An apparatus that is arranged to monitor an output voltage to adjust a pulse width that is associated with a pulse control signal, the apparatus comprising:

a feedback means that is arranged to provide a feedback signal that is responsive to the output voltage;

a ramp means that is arranged to initiate a ramp signal in response to a clock signal;

a first comparator means that is arranged to provide a start signal in response to the ramp signal and a ramp reference level;

a second comparator means that is arranged to provide a stop signal in response to the feedback signal and the ramp signal;

a first memory means that is arranged to provide a memory clock signal in response to the start signal and a clock signal; and a second memory means that is arranged to deactivate the pulse control signal when the start signal and the stop signal are both asserted, and also arranged to activate the pulse control signal when the memory clock signal has an edge transition.

16. The apparatus of claim 15, wherein the first comparator means has a built-in offset that has a dominant effect on the pulse width.

17. The apparatus of claim 15, wherein the ramp reference level corresponds to at least one of: a minimum level associated with the ramp signal, and a sum of the minimum level associated with the ramp signal and an offset amount such that the ramp reference level has a dominant effect on the pulse width.

18. The apparatus of claim 15, wherein the apparatus is arranged such that a pulse width associated with the pulse control signal linearly ranges down to an approximate value of zero.

19. The apparatus of claim 15, further comprising an output means that is arranged to provide the output voltage in response to the pulse control signal.

20. A method for adjusting a pulse width that is associated with a pulse control signal, the apparatus comprising:

monitoring an output voltage;

providing a feedback signal in response to the output voltage;

initiating a ramp signal in response to a clock signal;

comparing the ramp signal to a reference signal;

asserting a start signal when the ramp signal exceeds the reference signal;

comparing the ramp signal to the feedback signal;

asserting a stop signal when the ramp signal exceeds the feedback signal;

de-asserting the pulse control signal when the stop signal and the start signal are asserted; and asserting the pulse control signal when the start signal is asserted and the stop signal is de-asserted.

* * * * *

UNITED STATES PATENT AND TRADEMARK OFFICE
CERTIFICATE OF CORRECTION

PATENT NO.     : 6,828,836 B1
DATED          : December 7, 2004
INVENTOR(S)    : Barrow et al.

It is certified that error appears in the above-identified patent and that said Letters Patent is hereby corrected as shown below:

Column 3,
Line 42, "InS" should read -- 1nS --.

Column 4,
Line 2, "1200-1201" should read -- I200-I201 --.
Line 4, "1200" should read -- I200 --.
Line 14, "1200" should read -- I201 --.

Signed and Sealed this

Twenty-fourth Day of May, 2005

JON W. DUDAS
*Director of the United States Patent and Trademark Office*